United States Patent [19]
Li

[11] Patent Number: 4,890,783
[45] Date of Patent: Jan. 2, 1990

[54] CERAMIC-METAL JOINING

[76] Inventor: Chou H. Li, 379 Elm Dr., Roslyn, N.Y. 11576

[21] Appl. No.: 277,666

[22] Filed: Nov. 29, 1988

[51] Int. Cl.[4] .................. B23K 31/00; B23K 35/22
[52] U.S. Cl. .................... 228/122; 228/124; 228/263.12; 228/226; 148/127
[58] Field of Search .......... 228/122, 124, 226, 263.12; 148/127

[56] References Cited

U.S. PATENT DOCUMENTS

| | | | |
|---|---|---|---|
| 3,132,044 | 5/1964 | Pearsall | 228/263.12 |
| 3,805,372 | 4/1974 | Wagenknecht | 228/226 |
| 4,348,131 | 9/1982 | Shimanuki et al. | 228/226 |
| 4,710,235 | 12/1987 | Scruggs | 148/127 |
| 4,757,934 | 7/1988 | Greenstein | 228/263.12 |

FOREIGN PATENT DOCUMENTS

| | | | |
|---|---|---|---|
| 95671 | 6/1983 | Japan | 228/263.12 |
| 35075 | 2/1984 | Japan | 228/263.12 |
| 231471 | 10/1985 | Japan | 228/263.12 |
| 231472 | 10/1985 | Japan | 228/263.12 |
| 251179 | 12/1985 | Japan | 228/263.12 |
| 31368 | 2/1986 | Japan | 228/263.12 |
| 53174 | 3/1986 | Japan | 228/263.12 |
| 151070 | 7/1986 | Japan | 228/263.12 |

Primary Examiner—Richard K. Seidel
Assistant Examiner—Samuel M. Heinrich

[57] ABSTRACT

A method for improving the reliability of a ceramic-metal joint by reducing the dynamic mismatch stresses and strains on the ceramic due to the mismatch in thermal expansions of the two materials. This is done by bonding with a metal layer the ceramic to metal to form a bonding interfacial region between the ceramic and metal; and radially grading the interface region the thermal conductivity, thermal expansion coefficient, or tensile strength of the metal layer. An article in the form of a laterally graded, metallic bonding disc for overcoming problems of dynamic mismatch stresses and strains is also disclosed and claimed.

38 Claims, 1 Drawing Sheet

CERAMIC-METAL JOINING

BACKGROUND

1. Field

This invention relates to ceramic-metal joining, and more particularly relates to ceramic-metal joining with uniform ceramic metallizing compositions and specially graded seals to produce reproducibly strong and thermomechanically shock-resistant joints.

The idea of this invention was conceived partly with government support under Department of Energy (DOE) 1986 Small Business Innovative Research (SBIR) Phase I contract No. DE-AC02-86ER80382 titled "Improved Brazing Techniques for Machinable Glass Ceramics". DOE disclaims any invention by calling the idea not new thereby rejecting the SBIR Phase II development work. The constructive and actual reduction to practice of this invention was therefore made with 100% private funding. Also, prior to the signing of this DOE contract, some basic ideas on the invention already were conceived by the inventor, as shown in the attached copy of the proposal titled "Improved Brazing Techniques for Machinable Glass Ceramics", submitted to DOE on Jan. 15, 1986 and carrying DOE file No. 4571-861. A copy of the final report on the DOE contract and submitted to DOE on Dec. 9, 1986 is also enclosed. The Government may or may not have certain rights in this invention.

2. Prior Art

A serious problem with present ceramic metallizing methods is the difficulty of achieving uniform metallized layers formed on the ceramic. Take, for example, the commonly used heavy metal processes, such as W-yttria ($W-Y_2O_3$), W-Fe, or Mo-Mn. In these and many similar joining methods, segregation of the mixed metal or other powders takes place due to their differing specific gravities, shapes, sizes, porosities, and surface smoothness. These segregations occur at all times: during the mixing of the powders, storing of the powder suspensions, application of the suspensions, settling of the suspended powder particles, and drying of the suspension. Further, these segregations occur so fast as to be practically uncontrollable, as will be shown shortly.

In general, spherical, heavy, large, smooth, and dense particles settle first and early in the binder or suspension medium. Upon settling, these particles tend to roll or move sidewise or downward toward the corners or boundaries faster and further than odd-shaped, light, small, rough, and porous particles of otherwise identical characteristics.

Take the $W-Y_2O_3$ mixed powders in an organic binder of specific gravities of 19.3, 4.5, and 0.98, respectively. Such a suspension, even if perfectly mixed up by shaking, stirring, roller-milling, or otherwise, will immediately tend to segregate. More specifically, the initial settling acceleration due to gravitational minus buoyancy forces on W powders is $980.6 \times (19.3-0.98)/19.3 = 930.8$ cmxcm/sec, while that of $Y_2O_3$ powders is only 767.0 cmxcm/sec.

In a mixing, storing, or carrying bottle 10 cm high and containing a perfectly mixed suspension of these metallizing powders, the time to completely settle out is only 147 ms (milliseconds) for W powders, if uniform acceleration is assumed. At the tip of a paint brush having a suspension drop 0.3 cm in diameter, the complete settling time of these same W powders is merely 25.4 ms, while on a horizontally painted or sprayed layer 0.1 cm thick, the same settling time is only 14.7 ms. In all these cases, the complete settling time for the $Y_2O_3$ powders is always the square root of $930.8/767.0=1.21$, or 21% longer.

Note in particular that the powder segregations with uniform accelerations may be completed within 147 to 14.7 ms. Such short times indicate that the $W-Y_2O_3$ powder segregations are beyond human controls. Painted or sprayed mixed powder layers are thus always not uniform.

In metallizing onto a horizontal ceramic surface to be metallized, most of the W powders immediately settles out. The first layers are therefore always very rich in W, and correspondingly very poor in $Y_2O_3$. These first layers are too refractory for the preset metallizing temperature (up to about 1550 C.) so that the ceramic surfaces are not sufficiently metallized, or not at all. The last settling layers, on the other hand, are too rich in the fluxing $Y_2O_3$. Again, the ceramic surfaces are improperly metallized, with only a glassy layer being formed which is very weak in strength and thermal or thermal shock resistance.

Thus, common metallizing results on ceramics are often erratic and uncontrollable. The metallized surface may contain loose and unmetallized spots with high heavy refractory metal content, as well as non-wettable spots due to the high flux content. The entire process is critical and involved, and yet nonuniform. The resultant ceramic-metal joints or ceramic coatings on metals are weak, costly, nonreproducible, and usually not vacuum-tight, or temperature-resistant.

Painting or spraying onto vertical or inclined surfaces results in vertical and additional lateral segregations and gradations, and gives added poor uniformity, reproducibility, and bonding strength.

While only the effect of gravitational density segregation has been considered in some detail, the other segregation variables such as powder shape, size, porosity, and surface roughness are also important.

A second important problem with common joining processes is the lack of control, or even understanding, of dynamic mismatches of temperatures, stresses, and strain profiles in the joint region, and their variations with time. Another aspect of this invention is therefore to describe such dynamic mismatch phenomena, and to specially tailor-grade the composition and/or physical property profiles of the joint region so that the maximum or critical transient mismatch stresses never exceed the local material strength at any point inside the joint region, at any time during the heating or cooling of such joints in processing or service.

Accordingly, an object of this invention is to provide improved ceramic-metal joints and joining methods;

A further object of this invention is to provide improved ceramic metallizing methods for these joints;

A broad object of this invention is to minimize gravitational segregations of the components in the metallizing methods prior to the joining;

Another broad object of the invention is to specially tailorgrade the composition and/or property profiles in the joint regions to ensure that the maximum dynamic or transient stresses do not exceed the local material strengths at any point and time.

Further objects and advantages of my invention will appears as the specification proceeds.

SUMMARY

To these ends, the present invention provides a method for improving the reliability of a ceramic-metal or other joint between two solid materials against dynamic mismatch stresses due to differing thermal expansions during transient heating or cooling of the joint. This method comprises grading the thermal conductivity, thermal expansion coefficient, and/or softness or shock-absorbing ability of the bonding metal layer. The grading is done laterally or in directions parallel to the bonding interfacial region, rather than axially or normally of the interfacial region as in the common practice for overcoming severe static thermal mismatch stresses.

BRIEF DESCRIPTION

The invention and its further objects and features will be more clearly understood from the accompanying drawing in which.

DETAILED DESCRIPTION

Figure 1:
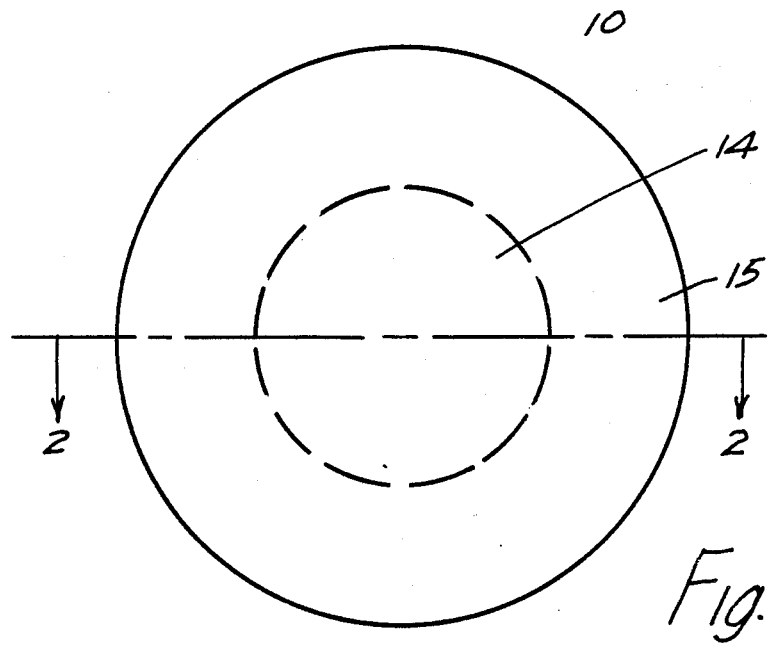
FIG. 1 is a top view showing the ceramic end of the joint.
Figure 2:
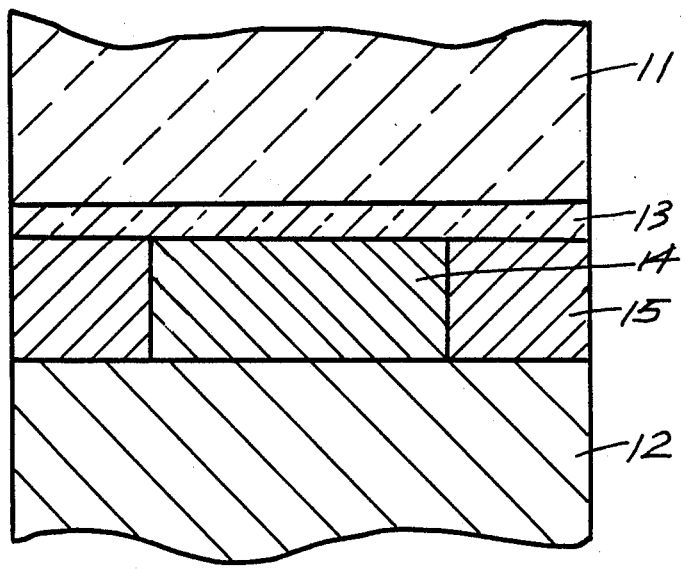
FIG. 2 is a cross-section view of the joint taken along the cross-section line 2-2 of FIG. 1.

It will be understood that the specific embodiments described herein are merely illustrative of the general principles of the invention and that various modifications are feasible without departing from the spirit and scope of the invention. That is, the invention is of general applicability for improving the quality of the ceramic-metal joints or joining methods, or coatings of ceramics on ceramics, or on metals. It is also evident that materials, structures, and methods other than those especially described can be used to practice the invention.

Stokes in 1851 first considered the resistance R which a fluid medium of density $d_m$ and viscosity n offers to the movement of a spherical particle of diameter D and density $d_p$ suspended in it, and arrived at the equation $R = 3\pi D v n$.

The small sphere settling in the fluid or suspension medium is acted on by the force of gravity with gravitational constant g, $\pi D^3 d_p g/6$ acting downward; and by the buoyant force of the fluid, $\pi D^3 d_m g/6$, given by Archimedes' principle and acting upward. The resultant net gravitational force G is $\pi D^3 (d_p - d_m) g/6$ acting downward, producing a downward acceleration, a.

When the resistance R exactly equals this net gravitational force G, the acceleration reduces to zero; the final velocity, $v_f$, becomes constant. There then results:

$$3\pi D n v_f = \pi D^3 (d_p - d_m) g/6$$

Hence, the final velocity is: $v_f = (d_p - d_m) g D^2/18 n$, the equation of Stokes' law which has been shown to be widely valid.

For a given fluid density ($d_m$) at a specific temperature (viscosity n) and a given sphere (of density $d_p$ and mass M), the Stokes' equation gives a velocity constant:

$$v_c = v_f/D^2 = (d_p - d_m) g/18 n$$

Also the velocity at ay time starting from rest, t, is:

$$v = (1 - \exp(-Rt/M)) \times v_f$$

where the settling distance at time t is:

$$s_t = (t - (1 - \exp(-Rt/M)) \times M/R) \times G/R$$

The velocity equation shows that the exact $v_f$ is not reached until after infinitely long time when the exponential term in the equation turns to zero and then the velocity reduces to $v = v_f$, as it should.

With the Stokes' law, one can calculate the velocity constants, $v_c$ in 1/cm-sec, $v_s$, for the settling in water at 20 C. ($d_m = 1.0$ and $n = 0.010$) of various metal or oxide powders, with densities in g/cc in parentheses, as follows: W (19.35) 100,000, $Y_2O_3$ (5.01) 21,900, Fe (7.87) 37,400, Mo (10.2) 50,100, Mn (7.2) 33,800, $WO_3$ (7.16) 33,600, $Fe_2O_3$ (5.24) 23,100, $MoO_3$ (4.692) 20,100, and $MnO_2$ (5.026) 21,900.

Thus, in the W-$Y_2O_3$ metallizing process, because the W powders are 3.9 (19.35/5.01) times heavier than $Y_2O_3$, the velocity constants c's of the two components differ by a factor of 100,000/21,900=4.6 times. That is, for a given powder size D, the final constant settling velocity $v_f$ of W spheres is 4.6 times greater than that of $Y_2O_3$ spheres. As discussed above, this wide difference in velocities results in severe gravitational segregation and early depletion of W particles in the settling mixtures and, therefore, poor metallizing results.

It can also be seen that the powders in the mixed oxide processes, e.g., $WO_3$—$Fe_2O_3$, are more more uniform, or less varying, in densities, $d_p$, than mixed particles of the same metals, e.g., W—Fe. Thus, the $WO_3$—$Fe_2O_3$ process shows density and velocity constant ratios of 1.366 and 1.455, vs 2.459 and 2.674, respectively, for the W—Fe process.

Similarly, in the Mo—Mn process, replacing the metal powders by their respective oxides reduces the differences in the ratios of velocity constants, $v_c$, and final velocities, $v_f$, from 48.2% to only 9.0% and 19.2% to 4.2%, respectively. In addition, the metal particles, i.e., W, Fe, Mo, and Mn when reduced during metallizing from their respective oxides are smaller than the initial oxide powders. These smaller sizes further promote homogenizations and metallizing results.

Hence, if we select and mix the $WO_3$ and $Fe_2O_3$ spherical powders in the size (diameter D) ratio of the square root of (33,600/23,100=1.455), i.e., 1.206, the final settling velocities of both these size-ratioed powders will be exactly the same. That is, by simply making the $Fe_2O_3$ powders 20.6% larger than the $WO_3$ powders, the mixed particles will finally settle in water at 20 C. at exactly the same velocity. This condition leads to metallizing uniformity due to the uniform composition of the finally deposited layers.

The final settling velocities of the two mixed powders, $v_s$'s, however, come only after some settling time, $t_s$, when a specific amount, Q, of the mixed powders has already settled out at differing velocities. From this settling time, $t_s$, for the specific combination of component powders, the settled amount Q and material use efficiency can be computed from the materials remaining after the settling time, $t_s$. The materials already settled before $t_s$ is the presettled distances, $s_t$, multiplied by the initial material densities. The already settled materials are, however, not lost, since they can be recirculated and reused in subsequent metallizing runs.

By repeated iteration or computer simulation, the best mixed-powder metallizing process for optimal combined metallizing uniformity and material use efficiency can be systematically determined. Based on these principles, method and equipment can be developed for controlling the turn-on time for starting to deposit the mixed powder at nearly equal final settling velocity, $v_f$, into metallizing layers with the size-ratioed powders.

In practice, we specify that the two settling velocities of the mixed particles are within a certain prespecified percentage, e.g., 20 or 10%, of each other. Still, gravitational segregations are minimized. Naturally, the smaller the percentage of velocity or useful powder size differences, $\Delta v$ and $\Delta s$, respectively, the lower the material use efficiency on a particular, mixed-powder combination. An engineering compromise must, therefore, be struck.

To completely eliminate gravitational segregations, solution metallizing is the ideal process. One difficulty of metallizing MACOR, Corning Glass's machinable glass ceramic, by the solution method is the relatively low, allowable metallizing temperature of about 950 C. The solubilities of the metallizing compounds are also restricting factors. Still, many potential metallizing compounds are soluble or at least partly soluble. Zinc chloride and sodium molybdate, for example, are soluble up to 432 and 65 grams, respectively, per 100 cc of cold water. Such a composite solution may be used for MACOR or other ceramics.

Another important consideration in making joints between dissimilar materials relates to thermal mismatch stresses and strains. In any ceramic-metal joints, or for that matter, any joining of two dissimilar materials, the matching or mismatch of their thermomechanical characteristics in general, and thermal expansion coefficients in particular, is extremely important. From this mismatch of their thermal expansions, thermal stresses are generated.

Mismatches in other thermomechanical characteristics also result in other thermomechanical mismatch stresses and strains. The magnitude of these mismatch stresses and strains determines the failure probability of the joint.

Generally, the thermal expansion mismatch differentials of within 100 ppm (parts per million) are considered as allowable, according to Hagy and Ritland's paper on "Viscosity Flow in Glass-to-Metal Seals," J. Amer. Ceram. Soc., Vol. 40, pp. 58–62, 1957. Such thermal expansion coefficients and differentials relate only to the static or equilibrium case, and may not truly represent dynamic or transient conditions when the joint is being heated up or cooled down. Yet such transient conditions often exist during the services of the joint.

Unlike the commonly used static thermal expansion mismatch, the dynamic mismatch in thermal expansion coefficients is not constant but varies with the bonded materials shapes and sizes, physical and surface properties, and heating or cooling conditions and times.

As will be shown, the dynamic expansion strain mismatch may exceed the yield point of the ceramic materials, while the dynamic mismatch stress often exceeds the flexure or even comprehensive strengths of these same materials. What fails most ceramic-metal joints is the dynamic, rather than the static, thermal expansion mismatch.

Using this dynamic mismatch technique, we have been able to determine the location, magnitude, and occurrence time of the maximum or critical mismatch stresses, and take measures to reduce the dynamic mismatch stresses on the relatively weaker ceramic so that the ceramic is no longer failing from the high stresses.

Dynamic mismatches result partly from the fact that metals and ceramics have widely different thermal conductivities. The conductivities for metals range from 0.014 cal/sq. cm/cm/degree C./sec for tellurium, to 1.0 for silver (same unit), while those for ceramics are from 0.0018 for glass to 1.8 for beryllia.

During heating of a ceramic-metal joint, the ceramic temperature lags behind that of the metal, often markedly so; while under cooling the opposite is true. This produces different temperature profiles in the metal and ceramic at a particular time instant on either heating or cooling. Dynamic mismatches in temperatures, strains (i.e., expansions on heating or shrinkages on cooling), and stresses (strains multiplied by Young's moduli) then result.

Take the special example of the case of a long ceramic rod joined end-to-end to a similarly sized metal rod. The ceramic may be, for example, Corning Glass's machinable glass ceramic (MACOR), while the metal may be SAE 1010 carbon steel. The joint is brazed at 950 C. and is, for the worst-case condition, suddenly air quenched in a room-temperature (20 C.) ambient.

The Fourier equation for independent radial heat conduction in long ceramic and metal cylinders is well known. The solution of the cylindrical heat conduction problem consists of an infinite series, each term of which is a product of a Bessel's function and an exponential function, as given in various textbooks on heat conduction. Data tables and master charts for cylindrical heat diffusion have been compiled. See, e.g., 1961 Gebhart's "Heat Transfer," McGraw-Hill, New York). With these equations, data tables, and master charts, one can determine the temperature profiles at different locations (i.e., radial positions, r, in a cylindrical end-to-end joint) at various time instants. From these profiles the critical temperature profile with the associated, maximum transient mismatch stresses and strains can be calculated.

The cooling down of a MACOR-metal joint from the brazing to room temperatures represents one of the most severe thermal changes, because of the wide temperature range involved. The step-by-step temperature changes, i.e., $u_m$ and $u_s$ for the temperatures of MACOR and steel, respectively, at cooling time t in seconds, at the center, (r=0) of the interfacial regions of a two-inch diameter, rod-type MACOR-steel joint are given in Table 1. Other tables have also been prepared for rods of different diameters.

The data used in the computations for Table 1 are: rod diameter D=2 in=5.08 cm, rod radius r=2.54 cm, surface heat transfer coefficient=0.1 per inch for both steel and MACOR, thermal diffusivities=0.108 cm$_2$/sec for steel and 0.0054 for MACOR, initial temperature of both MACOR and steel=950 C., and room temperature=20 C.

The computed data in Table 1 show, for the particular case treated, the maximum temperature differential between MACOR and steel at the axial center point, (or r=0), i.e., $\Delta u = u_m - u_s$, at different cooling times t in seconds. Thus, immediately upon cooling after brazing (t=0), this differential is zero because both the MACOR and steel are at the same brazing temperature of 950 C. Subsequently, faster cooling of the steel rod relative to MACOR causes this differential to increase with time t, until both rods are significantly cooled when the temperature differential decreases. After 29,900 seconds (8.3 hours), for example, both rods are within a few degrees of the room temperature at 20 C. The maximum temperature differential reaches 775 C. at about 1,000 seconds after the air cooling, giving rise to the maximum or critical dynamic mismatch stress and strain. Table 1 also shows that the temperature differential $T = u_m - u_s$ reaches 113, 144, 217, 282, 478, and 703 C. at 47.8, 59.8, 89.6, 119, 239, and 358 seconds, respectively, after the same cooling from 950 C.

By comparison, the maximum temperature differential of 727 C. at the axial center point of a one-inch (or $r = 1.27$ cm) diameter MACOR-steel joint is reached sooner, at about 440 seconds after cooling.

The linear thermal expansion coefficients, f, are defined as the thermal expansion per unit length per unit degree Centigrade. As given in the literature, they refer only to the static case. These coefficients are constants, at least for the respective temperature ranges. Within these ranges, they are, therefore, constants and independent of the specimen temperature, cooling or heating rates. In addition, these coefficients do not depend on the specimen geometries, sizes, diffusivities, surface characteristics, heating or cooling conditions, and initial and final temperatures.

TABLE 1

Nonsteady Heat Transfer Computations
For a 2-inch MACOR-Steel Joint
Cooling from 950° C. to 20° C.

| t | $u_m$ | $u_s$ | $u_m - u_s$ |
|---|---|---|---|
| 0.0 | 950 | 950 | 0 |
| 6.0 | 950 | 947 | 3 |
| 12.0 | 949 | 935 | 14 |
| 23.9 | 949 | 901 | 48 |
| 35.8 | 949 | 867 | 82 |
| 47.8 | 948 | 835 | 113 |
| 59.8 | 948 | 804 | 144 |
| 89.6 | 948 | 731 | 217 |
| 119 | 947 | 665 | 282 |
| 239 | 935 | 456 | 478 |
| 358 | 918 | 316 | 703 |
| 478 | 901 | 220 | 681 |
| 598 | 884 | 155 | 729 |
| 717 | 868 | 112 | 756 |
| 836 | 851 | 82 | 769 |
| 956 | 835 | 62 | 773 |
| 1200 | 804 | 39 | 765 |
| 1792 | 731 | 23 | 708 |
| 2390 | 665 | 22 | 643 |
| 3580 | 551 | 22 | 528 |
| 4780 | 456 | 21 | 436 |
| 5980 | 379 | 21 | 358 |
| 7170 | 316 | 21 | 296 |
| 9560 | 220 | 21 | 199 |
| 12000 | 155 | 21 | 134 |
| 14300 | 112 | 21 | 91 |
| 19100 | 62 | 20 | 42 |
| 23900 | 39 | 20 | 19 |
| 29900 | 27 | 20 | 7 |
| 35800 | 23 | 20 | 3 |
| 41800 | 21 | 20 | 1 |

The static thermal shrinkage (or negative expansion) strain, e, for a given material is, by definition, the static thermal expansion coefficient, f, multiplied by the temperature range of cooling, $\Delta u$, i.e., $e = f \times \Delta u$. Thus, for the steel rod, this strain is: $e_s = f_s \times \Delta u_s$, and for the MACOR rod, it is: $e_m = f_m \times \Delta u_m$.

Under equilibrium conditions, the materials of the joint, i.e., MACOR and steel, are supposed to be in constant thermal equilibrium. That is, $u_m = u_s$. Both materials are thus at the same brazing temperature of $u_0$ at the beginning of cooling ($t = 0$). Also, at any time t during the cooling, the cooling temperature range for MACOR and steel are always the same in the static case. Thus:

$$\Delta u_m = u_0 - u_m = u_0 - u_s = \Delta u_s = \Delta u,$$

and the static expansion mismatch strain between steel and MACOR is:

$$\Delta e = e_s - e_m = (f_s - f_m) \times \Delta u = \text{constant} \times \Delta u.$$

On the other hand, dynamic thermal expansion coefficients, f*, and the resultant dynamic mismatch strains, e*, and stresses, s*, strongly depend on the joint materials, geometries, sizes, physical and surface properties, and heating or cooling conditions.

Starting with zero strain on cooling from the brazing temperature of 950 C., the dynamic strain in the steel rod is: $e^*_s = f_s \times \Delta u_s$ where $\Delta u_s = 950 - u_s$, while that in the MACOR rod is: $e^*_m = f_m \times \Delta u_m$ where $\Delta u_m = 950 - u_m$.

The difference in dynamic mismatch strain, i.e., $$\Delta e^* = f_s \times \Delta u_s - f_m \times \Delta u_m$$

The dynamic mismatch strain reaches a maximum of about 0.0123 at $t = 1,000$ seconds. Such high strains exceed even the yield point of steel joined to the rigid MACOR ceramic.

The dynamic thermal expansion coefficient mismatch, $\Delta f^*$, can be computed by dividing the dynamic mismatch strain, $e^*_s - e^*_m$, by the average cooling temperature range, i.e., $\Delta u_v = 950 - (u_s + u_m)/2$. This dynamic coefficient mismatch, for the 2-inch MACOR-steel rod joint cooling from 950 C. to 20 C., still depends greatly on the cooling time t. It reaches a maximum rate of about 29.6 ppm/degree C. at a cooling time of about 90 seconds, but continuously drops down to less than 5.6 ppm/degree C. at $t = 1,000$ seconds, as can be computed from the data in Table 1. The total dynamic coefficient mismatch over the temperature range of 930 C. far exceeds the maximum of 100 ppm considered allowable by Hagy and Ritland.

It can also be shown that the dynamic expansion coefficient mismatch, $\Delta f^* = (f^*_s - f^*_m)_{av}$, for the 2-inch MACOR-steel rod joint cooling from 950 C. to 20 C., is two to five times greater than the corresponding mismatches for the static or equilibrium case, for cooling time t of 10 to 10,000 seconds.

Statically, MACOR only marginally "matches" with a few low-expansion metals such as the 42 Ni-Fe alloy. Because of this two to five times greater dynamic expansion coefficient mismatch relative to the static coefficient mismatch, we must conclude that, dynamically, MACOR and steel joints now become totally "mismatched", at least in so far as the specimen configuration, size, and brazing conditions given above are concerned.

To approximately compute the dynamic mismatch stresses, one may further neglect the presence of the braze and the metallized layers, and use a Timoshenko approach as follows. Consider a portion of the steel specimen of unit length and unit cross-sectional area, brazed together with a MACOR specimen of equal length and cross-sectional area. At time $t = t$ after cooling from the brazing temperature of 950 C., the temperature of the steel is $u_s$ and $\Delta u_s = 950 - u_s$, while the temperature of MACOR is $u_m$ and $\Delta u_m = 950 - u_m$. The steel specimen has thus shrunk from unit length to $1-f_s 33 \Delta u_s$, while the MACOR has shrunk to $1-f_m \times \Delta u_m$. The steel has shrunk more than MACOR, since both $f_s$ and $\Delta u_s$ are greater than $f_m$ and $\Delta u_m$. To maintain joint integrity particularly at the ends, the originally stress-free but overshrunk steel must be stretched with dynamic tensile stress $s_s^*$ by the adjoining MACOR, to length y from length $1-f_s \times \Delta u_s$, while the undershrunk MACOR must be compressed with dynamic compressive stress $s_m^*$ by the steel, to the same length y from length of $1-f_m \times \Delta u_m$.

Hence, the tensile stress in the steel, $s_s^*$, is $$s_s = E_s \times (y-1+f_s \times \Delta u_s)/(1-f_s \times \Delta u_s)$$

where $e_s$ is the Young's modulus of steel, i.e., 30,000,000 psi; while the compressive stress in MACOR, $s_m$, is $$s_m = E_m(1 f_m \times \Delta u_m - y)/(1-f_m \times \Delta u_m)$$

where $E_m$ is the Young's modulus of MACOR, i.e., 5,000,000 psi.

Apparently, $s_s^* = s_m$. Hence, $$y = ((1-f_m \times \Delta u_m)E_m + (1-f_s \times \Delta u_s))/(E_s + E_m)$$

From these equations, we compute the equal dynamic mismatch stresses in MACOR and steel, $s_m^* = s_m$, to reach over 52,800 psi, well above MACOR's flexual strength of 15,000 psi or even its comprehensive strength of 50,000 psi.

Similarly, dynamic or transient differences in temperatures, thermal expansion coefficients, thermal expansion strains, and thermal mismatch stresses have been computed for differently sized cylindrical MACOR-steel joints, at various radial locations and cooling time instants. The dynamic mismatch stresses and strains are all unexpectedly high. Measures must therefore be taken to reduce the dynamic mismatch stresses on the relatively weak ceramic so that the ceramic is no longer subjected to the high stresses. This reduction can be achieved by, e.g., absorbing a major portion of the dynamic mismatch stresses normally present in the ceramic through the use of a soft, yieldable metallic braze. These measures prevent the brazed joint failures particularly from these dynamic mismatch stresses, because residual or actual mismatch stress between the two joined materials is the theoretical mismatch stress with a portion thereof absorbed in the metallized or brazed layer.

Specifically, this invention also describes the following methods, for uses singly or in combination, to minimize or neutralize these high mismatch stresses and strains;

(1) Using a soft, yieldable metal layer to braze the metallized ceramic to the metal, and to absorb within the braze layer a large or major portion of these mismatch stresses so that the relatively weak MACOR or other ceramic is no longer subjected to high stresses thereby preventing fractures;

(2) Radially grading, or controllably and gradually changing in (i.e., parallel rather than perpendicular to) the joining plane or bonding interfacial region, the thermal conductivity, expansion coefficient, and tensile strength of the braze metal, to ensure that the maximum residual mismatch stress, after absorption in the braze, will not exceed the local material strength in the ceramic at any point and time; and (3) Axially grading, or controllably changing normally of or perpendicular to the joining plane or bonding interfacial region, from the ceramic side toward the metal side, the thermal expansion coefficient of the braze layer to minimize direct mechanical interaction between the steel and ceramic members.

The first two objectives are achieved by providing a novel composite braze disc used to join the metallized ceramic cylinder 11 to the metal cylinder 12 to form the joint 10. The ceramic cylinder has a metallized layer 13 at its lower end, while the composite braze disc has a pure copper central core 14 within the opening of an outer copper alloy (e.g., 70:30 Zn Cartridge brass) ring or washer 15. The entire metallized layer 13 and the composite braze disc 14 and washer 15 form the joint or bonding interfacial region. The linear thermal expansion coefficient of pure copper is 16.5 ppm/degree C., while that of, for example, 70 Cu:30 Zn Cartridge brass is 19.9 ppm/degree C. Also, the tensile strength of the brazing-annealed, soft pure copper is only 15,000 psi, while that of the 70:30 Cartridge brass is over 40,000 psi, or about three times greater.

These combinations of linear thermal expansion and tensile properties achieve the required results. In a ceramic-steel joint, the maximum or critical transient mismatch temperatures, thermal strains and stresses occur in the axial centers of the interfacial regions. We therefore have dead soft, brazing-annealed, pure copper at the core regions which are highly and easily yieldable to absorb most of the dynamic mismatch thermal strains and, therefore, stresses. Pure copper also has relatively low thermal expansion to reduce these mismatch effects in the first place. In addition, the pure copper is a good thermal conductor, equalizing the temperature between the centers, as well as their outer and regions, of steel-MACOR joint, and thus further minimizes mismatch strains and stresses.

On the other hand, the outer peripheral regions of the braze disc is made of relatively highly expansive but the lower thermal-conducting brass. At these peripheral regions, the mismatch temperature differentials are relatively small. The higher tensile strength is even desirable at the large-area peripheral regions to enhance the joint strength.

This composite braze disc design will thus provide the required radially tailor-graded profiles of braze composition, thermal expansion coefficient, braze strength, and thermal conductivity needed to overcome the critical dynamic mismatch stresses.

The composite braze discs can be made by, for example, metallurgically cladding or mechanical press-forming a sphere and a washer, at least two layers or two tubes, or other combinations together into a single layer.

Elemental interdiffusion during the braze manufacture, brazing operation, or special pre- or post-brazing heat-treatment can modify or provide any reasonable composition profiling in the braze discs for achieving the desired tailor-grading results.

If all these measures are still insufficient to prevent dynamic thermal mismatch failures, axial elemental grading or sudden composition changes may be added. One method consists of providing a disc of low-expansive metals such as Sylvania #4, Dumet, 50% nickel alloy, chrome-iron stainless, platinum, Sealmet, and titanium placed intermediately between the steel and the copper braze. In this way, the ceramic MACOR is mechanically isolated from the highly expansive steel.

The desired elemental profiling can also be achieved through controlled diffusion.

Skilled persons can, of course, select other yieldable metals such as gold, silver, tin, lead, indium, zinc, or even iron or nickel, or other materials to replace copper, and select other chemical elements to replace the copper-strengthening zinc. The resultant new alloys will, of course, be different in compositions, strengths, softnesses, yieldabilities, or shock-absorbing abilities, diffusivities, thermal conductivities, melting or softening points, and other properties.

The invention, as described above, is not to be construed as limited to the particular forms disclosed herein, since these are to be regarded as illustrative rather than restrictive. Various combinations, equivalent substitutions, or other modifications of the preferred embodiments described herein are obviously possible in light of the description, without departing from the spirit of the invention. In particular, other ceramics such as alumina or zirconia may be used instead of MACOR with the same or a modified metallizing composition. Accordingly, the invention is to be limited only as indicated by the scope of the following appended claims:

I claim:

1. A method for improving the reliability of a joint between a first body of a first solid material and a second body of a second solid material, said first solid material being dissimilar from and relatively weaker than said second solid material, said method comprising reducing the dynamic mismatch stresses on the relatively weaker first solid material body due to dynamic mismatches in thermal expansions between the two solid materials during transient heating or cooling of the joint so that the relatively weaker first solid material is no longer subjected to high stresses, comprising:

providing a metal layer on a selected surface of the body of the first solid material;

bonding with the metal layer the second solid material body to the selected surface of the first solid material body thereby forming with the metal layer a joint or bonding interfacial region between the two bodies; and grading from a central portion toward a peripheral portion of the joint at least one thermomechanical property of the material of the metal layer in the interfacial region to ensure that the maximum residual mismatch stresses will not exceed the local material strength in the first solid material at any point and time, said one thermochemical property being selected from the group consisting of thermal conductivity, thermal expansion coefficient, and softness or shock-absorbing ability.

2. A method as in claim 1 including heat-treating the joint to modify by controlled elemental diffusion the composition profiling in the metal layer.

3. A method as in claim 1 wherein said grading step includes grading at least two of the thermomechanical properties.

4. A method as in claim 3 wherein said grading step consists of grading simultaneously all the three listed thermomechanical properties.

5. A method as in claim 1 including selecting substantially pure copper as the material of the metal layer in the central region of the joint, and 70:30 Cartridge brass as the material of the metal layer in the peripheral regin of the same joint.

6. A method as in claim 1 including grading laterally from the center toward the periphery of the joint the thermal expansion coefficient of the material of the metal layer and providing at the periphery a material of the metal layer having a thermal expansion coefficient higher than that next to the periphery.

7. A method as in claim 1 wherein the material of the metal layer consists essentially of substantially pure copper.

8. A method as in claim 1 including reducing the transient or dynamic temperature differentials between the solid materials at the center of the joint where dynamic mismatch stresses are maximum.

9. A method as in claim 1 wherein said grading step comprises monotonically changing the thermal expansion coefficient of the metal layer material from the central portion toward the peripheral portion of the joint without generating additional stresses after the joint is made and cooled to room temperature.

10. A method as in claim 1 wherein the grading step comprises monotonically decreasing the thermal conductivity of the metal layer material from the central portion toward the peripheral portion of the joint.

11. A method as in claim 1 wherein the grading step comprises monotonically decreasing the softness of the metal layer material from the central portion toward the peripheral portion of the joint.

12. A method as in claim 1 wherein said providing step comprises supplying a first metallic surface layer onto the selected surface of the first solid material body and supplying a bonding metallic layer for joining the first metallic surface layer to the second material body.

13. A method as in claim 12 wherein the metal layer comprises a W/M[0]o-based material.

14. A method as in claim 12 wherein said bonding and grading steps are done in a single processing step.

15. A method as in claim 12 wherein said relatively weaker first solid material is a ceramic.

16. A method as in claim 12 wherein said bonding and grading steps alone, without any additional heat treatment of the joint, are effective in improving the reliability of the joint against the dynamic mismatch stresses.

17. A method as in claim 12 wherein said bonding and grading steps alone, without any additional stresses being formed in the joint after these steps, are effective in improving the reliability of the joint against the dynamic mismatch stresses.

18. A method as in claim 12 where the grading step comprises grading the thermal expansion coefficient of at least the material of the bonding metallic layer without generating additional stresses after the joint is made and cooled to room temperature.

19. A method as in claim 18 wherein the grading step comprises providing at least the bonding metallic layer with the highest thermal expansion coefficient material in the peripheral portion relative to the remaining portions of the joint.

20. A method as in claim 18 wherein said grading step comprises monotonically grading the thermal expansion coefficient of at least the bonding metallic layer material from the central portion toward the peripheral portion of the joint.

21. A method as in claim 18 wherein said grading step comprises substantially continuously increasing the thermal expansion coefficient of at least the bonding metallic layer material from the central portion toward the peripheral portion of the joint.

22. A method as in claim 12 wherein the grading step comprises grading the thermal conductivity of at least the material of the bonding metallic layer.

23. A method as in claim 23 wherein the grading step comprises providing at least the bonding metallic layer with the highest thermal conductivity material in the central portion relative to the remaining portions of the joint.

24. A method as in claim 22 wherein the grading step comprises monotonically grading the thermal conductivity of at least the bonding metallic layer material from the central portion toward the peripheral portion of the joint.

25. A method as in claim 22 wherein the grading step comprises substantially continuously decreasing the thermal conductivity of at least the bonding metallic layer material from the central portion toward the peripheral portion of the joint.

26. A method as in claim 12 wherein the grading step comprises grading the softness or shock-absorbing ability of at least the material of the bonding metallic layer.

27. A method as in claim 26 wherein the grading step comprises providing at least the bonding metallic layer with the softest material in the central portion relative to the remaining portions of the joint.

28. A method as in claim 26 wherein the grading step comprises monotonically grading the softness of at least the bonding metallic layer material from the central portion toward the peripheral portion of the joint.

29. A method as in claim 26 wherein the grading step comprises continuously decreasing the softness of at least the bonding metallic layer material from the central portion toward the peripheral portion of the joint.

30. A method as in claim 12 including selecting for the bonding metallic layer a substance having as a major portion thereof a material selected from the group consisting of Au, Ag, Sn, Pb, In, Zn, Fe, Ni, and Cu.

31. A solid metallic bonding layer for bonding a ceramic body to a second solid material body thereby forming a bonding interfacial region therebetween,
said ceramic body and said second material body having different thermophysical properties thereby creating residual mismatch stresses in the bonding layer, comprising:
a first solid metallic bonding material in one part of the bonding layer creating thereat a first actual or residual mismatch stress which is the theoretical local dynamic mismatch stress with a first portion thereof absorbed at least in the first bonding material;
a second solid metallic bonding material in another part of the bonding layer creating thereat a second actual or residual dynamic mismatch stress which is the theoretical local mismatch stress with a second portion thereof absorbed at least in the second bonding material;
said two solid bonding materials substantially differing in at least one physical properties thereby absorbing different portions of the actual mismatch stresses,
said first theoretical local mismatch stress being higher than said second theoretical local mismatch stress but said first portion being larger than said second portion so that both actual or residual dynamic mismatch stresses after the absorptions are less than those than can damage the bond between the ceramic and the second solid material.

32. A bonding layer as in claim 31 wherein the first bonding material is in the form of a central solid disc of the first metallic bonding material, while the second bonding material is in the form of an outer ring of the second metallic bonding material surrounding said central disc,
said two bonding materials substantially differing in said at least one physical property selected from the group consisting of chemical composition, thermal conductivity, thermal expansion coefficient, and softness.

33. A bonding layer as in claim 31 including an intermediate ring which is formed in situ from materials of said inner disk and outer ring with said at least one physical property also intermediate those of the materials of said inner disk and outer ring.

34. A bonding layer as in claim 31 wherein the ceramic body is relatively weaker than the second solid material body and including a soft, yieldable metal material at a central portion of the bonding interfacial region in the joint to absorb within the yieldable metal material a large portion of the dynamic mismatch stresses so that the relatively weaker ceramic is no longer subjected to high dynamic mismatch stresses thereby preventing failure of the joint.

35. A method for reducing the dynamic mismatch stress failure of a joint between two solid material bodies joined together with a solid metallic bonding layer therebetween thereby forming a joint or bonding interfacial region between the bodies, comprising:
providing a plurality of physically integrated joint elements in parallel at a plurality of locations on the bonding interfacial region;
at least one physical property of the joint element at one location being substantially different from the same property of the joint element at another location, so that the maximum or critical transient or dynamic mismatch stresses never exceed the local material strength at any point inside the joint region, at any time during the heating or cooling of such joints in processing or service.

36. A method as in claim 35 wherein the maximum transient or dynamic mismatch stresses vary along the bonding interfacial region and are respectively the reduced theoretical mismatch stresses due to absorption in at least the metallic bonding layer and including the additional step of increasing the absorption of such mismatch stress with the most absorption at the location where maximum theoretical dynamic stresses occur.

37. A method as in claim 35 wherein said one physical property is selected form the group consisting of thermal conductivity, thermal expansion coefficient, and softness or shock-absorbing ability.

38. A method as in claim 37 including laterally tailor-grading the physical property profile of the bonding interfacial region according to the maximum or critical transient or dynamic mismatch stresses so that these mismatch stresses never exceed the local material strength at any point inside the joint, at any time during the heating or cooling of such joints in processing or service.

* * * * *